US012701960B2

(12) United States Patent
Li et al.

(10) Patent No.: US 12,701,960 B2
(45) Date of Patent: Aug. 4, 2026

(54) BIPOLAR ESC TO PREVENT SUBSTRATE BACKSIDE DISCHARGING

(71) Applicant: Applied Materials, Inc., Santa Clara, CA (US)

(72) Inventors: Jian Li, Fremont, CA (US); Ganesh Balasubramanian, Fremont, CA (US); Govindarajasekhar Singu, Santa Clara, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 261 days.

(21) Appl. No.: 18/630,696

(22) Filed: Apr. 9, 2024

(65) Prior Publication Data

US 2025/0316520 A1     Oct. 9, 2025

(51) Int. Cl.
| | |
|---|---|
| *H01T 23/00* | (2006.01) |
| *H01J 37/32* | (2006.01) |
| *H10P 72/72* | (2026.01) |

(52) U.S. Cl.
CPC ...... *H10P 72/722* (2026.01); *H01J 37/32715* (2013.01); *H01J 2237/2007* (2013.01)

(58) Field of Classification Search
CPC .................................................. H10P 72/722
See application file for complete search history.

(56) References Cited

U.S. PATENT DOCUMENTS

| | | | | |
|---|---|---|---|---|
| 5,745,331 A | * | 4/1998 | Shamouilian | H10P 72/72 |
| | | | | 361/234 |
| 5,903,428 A | * | 5/1999 | Grimard | H10P 72/722 |
| | | | | 279/128 |
| 2007/0258186 A1 | * | 11/2007 | Matyushkin | H10P 72/72 |
| | | | | 361/234 |
| 2016/0049323 A1 | * | 2/2016 | Ye | H10P 72/722 |
| | | | | 361/234 |
| 2018/0301364 A1 | * | 10/2018 | Boyd, Jr. | H10P 72/722 |
| 2024/0420984 A1 | * | 12/2024 | Nguyen | H01J 37/32715 |

* cited by examiner

*Primary Examiner* — Stephen W Jackson
(74) *Attorney, Agent, or Firm* — Patterson + Sheridan, LLP

(57) ABSTRACT

Embodiments of the present disclosure provide an electrostatic chuck including a ring surrounding a top surface of the electrostatic chuck and a mesa extending along a diameter of the top surface of the electrostatic chuck such that the mesa contacts the ring on opposed ends thereof. The mesa is a single continuous feature. The mesa contacts a bottom surface of a substrate placed over the electrostatic chuck. The electrostatic chuck includes a first electrode and a second electrode. When a voltage is applied to the electrostatic chuck, an electric field is present between the first electrode and the second electrode. The mesa prevents the electric field from creating hatch marks on the top surface of the electrostatic chuck. The mesa is vertically offset from the first electrode and the second electrode or is vertically aligned with a gap defined between the first electrode and the second electrode.

20 Claims, 3 Drawing Sheets

BIPOLAR ESC TO PREVENT SUBSTRATE BACKSIDE DISCHARGING

BACKGROUND

Field

Embodiments described herein generally relate to semiconductor processing. More specifically, embodiments described herein relate to a bipolar electrostatic chuck (ESC) for preventing substrate backside discharging.

Description of the Related Art

Substrate support pedestals are widely used to support substrates within semiconductor processing systems during substrate processing. The substrate support pedestals generally include an electrostatic chuck bonded to a cooling base with a bond layer. An electrostatic chuck generally includes one or more embedded electrodes which are driven to an electrical potential to hold a substrate against the electrostatic chuck during processing. The cooling base typically includes one or more cooling channels and aids in controlling the temperature of the substrate during processing. Further, the electrostatic chuck may include one or more gas flow passages that allow a gas to flow between the electrostatic chuck and the substrate to assist in controlling the temperature of the substrate during process. The gas fills the area between the electrostatic chuck and the substrate, enhancing the heat transfer rate between the substrate and the substrate support. However, when a high electric field is present between a positive and a negative electrode of the electrostatic chuck, such high electric field can cause mechanical defects across a length of a top surface of the electrostatic chuck.

Accordingly, what is needed in the art are improved structures to prevent mechanical damage to electrostatic chucks.

SUMMARY

Embodiments of the present disclosure provide an electrostatic chuck including a ring surrounding a top surface of the electrostatic chuck and a mesa extending along a diameter of the top surface of the electrostatic chuck such that the mesa contacts the ring on opposed ends thereof. The mesa is a single continuous feature. The mesa contacts a bottom surface of a substrate placed over the electrostatic chuck. The electrostatic chuck includes a first electrode and a second electrode. When a voltage is applied to the electrostatic chuck, an electric field is present between the first electrode and the second electrode. The mesa prevents the electric field from creating hatch marks or cracking on the top surface of the electrostatic chuck. The mesa is vertically offset from the first electrode and the second electrode or is vertically aligned with a gap defined between the first electrode and the second electrode. The mesa has a thickness equal to a horizontal distance between the first electrode and the second electrode.

Embodiments of the present disclosure provide an electrostatic chuck including a first electrode and a second electrode and a mesa extending along a diameter of a top surface of the electrostatic chuck. A ring is formed around the top surface of the electrostatic chuck. The mesa contacts the ring on opposed ends thereof. The mesa is a single continuous feature. The mesa contacts a bottom surface of a substrate placed over the electrostatic chuck. When a voltage is applied to the electrostatic chuck, an electric field is present between the first electrode and the second electrode.

is applied to the electrostatic chuck, an electric field is present between the first electrode and the second electrode. The mesa prevents the electric field from creating hatch marks or cracking on the top surface of the electrostatic chuck. The mesa is vertically offset from the first electrode and the second electrode or is vertically aligned with a gap defined between the first electrode and the second electrode. The mesa has a thickness equal to a horizontal distance between the first electrode and the second electrode.

Embodiments of the present disclosure provide a method including forming an electrostatic chuck having a ring surrounding a top surface of the electrostatic chuck and forming a mesa extending along a diameter of the top surface of the electrostatic chuck such that the mesa contacts the ring on opposed ends thereof. The mesa is a single continuous feature. The mesa contacts a bottom surface of a substrate placed over the electrostatic chuck. The electrostatic chuck includes a first electrode and a second electrode. When a voltage is applied to the electrostatic chuck, an electric field is present between the first electrode and the second electrode.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
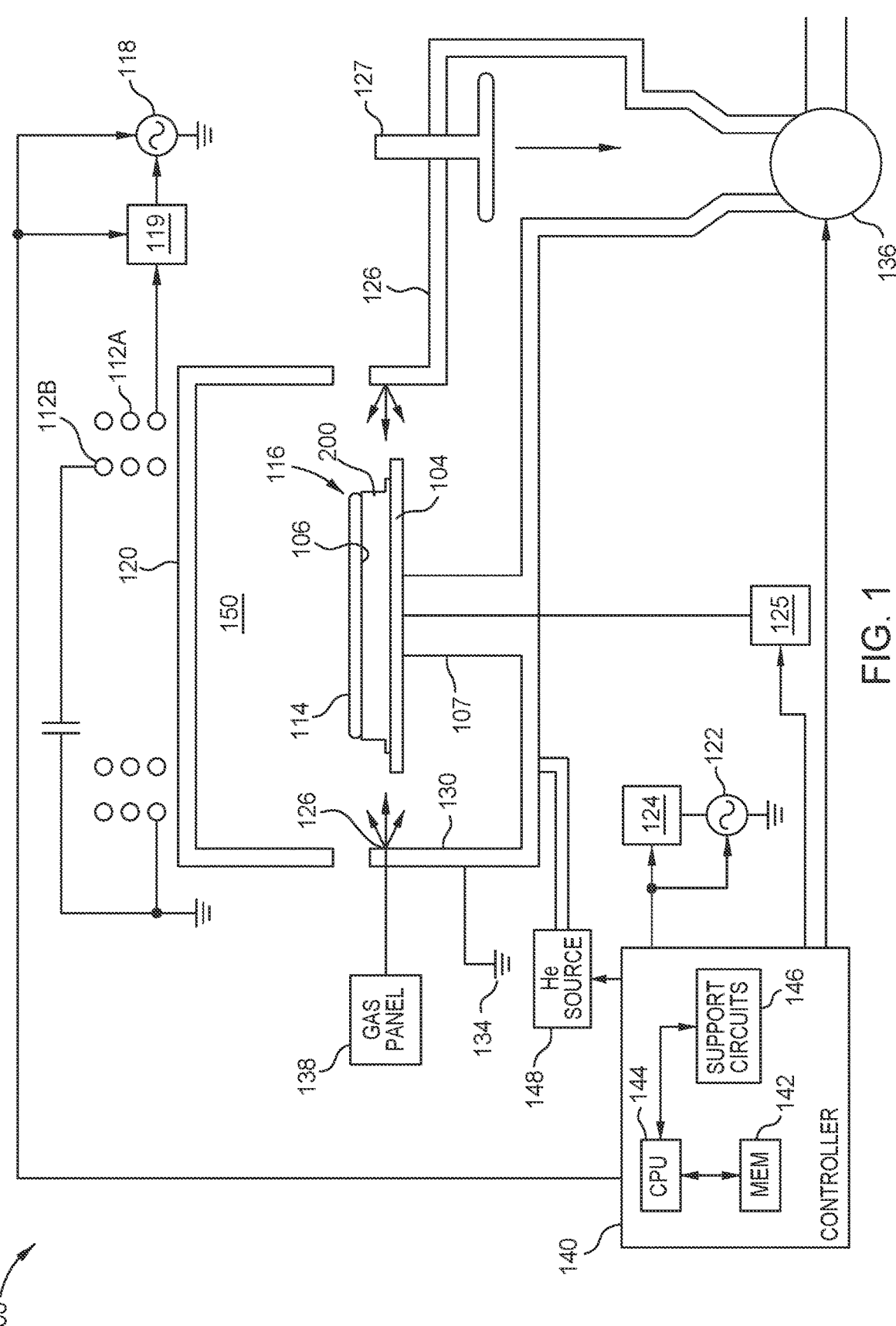
FIG. 1 is a schematic of a process chamber having a substrate support pedestal including an electrostatic chuck (ESC), according to one or more of the embodiments described herein.

Embodiments of the present disclosure generally relate to preventing DC discharge in an area between a substrate and an electrostatic chuck (ESC). The DC discharge is prevented by forming a mesa or ridge on the ESC that extends from one end of the ESC to the other end of the ESC. The new mesa can be a linear feature and extend along a diameter of a top surface of the ESC to contact a ring surrounding the top surface of the ESC on opposed ends thereof.

The fabrication of microelectronic devices typically involves a complicated process sequence requiring hundreds of individual processes performed on semi-conductive, dielectric, and conductive substrates. Examples of these processes include oxidation, diffusion, ion implantation, thin film deposition, cleaning, etching, and lithography, among other operations. Each operation is time consuming and expensive.

With ever-decreasing critical dimensions for microelectronic devices, the design and fabrication for these devices on substrates is becoming or has become increasingly complex. Control of the critical dimensions and process uniformity becomes increasingly more significant. Complex multilayer stacks used to make microelectronic devices involve precise process monitoring of the critical dimensions for the thickness, roughness, stress, density, and potential defects. Process recipes for forming the devices have multiple incremental processes to ensure critical dimensions are maintained. Typically, each incremental process may utilize one or more processing chambers that adds additional time for forming the devices and also increases opportunities for forming defects.

As critical dimensions on these devices shrink, past fabrication techniques encounter new hurdles. For example, hatch marks or mechanical defects can be formed on the top surface of the electrostatic chuck when a high electric field (DC field) is present between the positive and the negative electrodes of the electrostatic chuck. A high gas breakdown adjacent the bottom surface of the substrate may be culprit of the hatch marks or mechanical defects formed on the top surface of the electrostatic chuck. The DC discharge can cause cracking of the heater or ESC material, as well as any coating formed thereon.

In general, an electrostatic chuck assembly has an edge ring resting on a ceramic plate. The ceramic plate supports a substrate during plasma processing. The ceramic plate has one or more heaters therein that can heat the substrate up to, for example, 700 degrees C. The ceramic plate includes a pair of chucking electrodes for chucking the substrate. An edge electrode is extended to nearly the very edge of the ceramic plate, and can be powered by an alternating current (AC) power supply for tuning the plasma adjacent the edge of the substrate. This includes, for example, to create a plasma sheath at the substrate edge more similar to that over more central regions of the substrate, hence reducing non-uniform processing adjacent the substrate edge compared to the rest of the substrate. As a result, the available real estate on the substrate for productive manufacture of a semiconductor devices can be increased. By better control of the plasma at the circumferential outer region of the substrate, control of the film profile across the full surface of the substrate can be maintained while operating at frequencies from 350 kHz to 60 MHz. The ceramic plate enables AC, such as radio frequency (RF), pulsing therein at very low duty cycles with a pulsing frequency between 0.2 Hz to 20 Hz to prevent film damage by enabling bottom-up trench fill. The low duty cycle AC pulsing at the 0.2 Hz to 20 Hz level, can be utilized for plasma enhanced chemical vapor deposition (PECVD) and plasma enhanced atomic layer deposition (PEALD) processes which enable bottom-up filling of trenches by preventing the sidewalls of the trenches from closing in during the fill, which deters porous film formation in the trenches.

An embedded ground electrode helps to prevent AC coupling to the chamber bottom, thereby reducing required chamber depth, and thus, the chamber volume. The reduced chamber volume beneficially reduces the purge time required during a PEALD process. Advantageously, the high temperature electrostatic chuck assembly can perform both PECVD/PEALD deposition as well as in-situ etch/treatment processes all while using the same ceramic plate. The electrostatic chuck assembly enables improved film coverage at the outer circumferential portion of the substrate by using the edge electrode.

However, an electrostatic chuck assembly, just like any other mechanical component can experience wear and tear, as well as mechanical defects. In one example, a top surface of the electrostatic chuck can show hatch marks extending from one end of a ring to the other end of the ring encircling the electrostatic chuck. The example embodiments present an improved electrostatic chuck that can prevent hatch marks or cracks or mechanical defects from being formed on the top surface thereof. The improved electrostatic chuck includes a new mesa that extends along a length or diameter of the electrostatic chuck. The placement of the new mesa prevents DC discharging between a bottom surface of the substrate and a top surface of the electrostatic chuck, which in turn reduces the probability of hatch marks or cracks or mechanical defects being formed on the top surface of the electromechanical chuck.

FIG. 1 is a schematic of a process chamber having a substrate support pedestal including an electrostatic chuck, according to one or more of the embodiments described herein.

FIG. 1 depicts a schematic diagram of a process chamber 100, according to one or more embodiments. The process chamber 100 includes at least an inductive coil antenna segment 112A and a conductive coil antenna segment 112B, both positioned exterior to a dielectric, ceiling 120. The inductive coil antenna segment 112A and the conductive coil antenna segment 1128 are each coupled to a radio-frequency (RF) source 118 that produces an RF signal. The RF source 118 is coupled to the inductive coil antenna segment 112A and to the conductive coil antenna segment 1128 through a matching network 119. Process chamber 100 also includes a substrate support pedestal 116 that is coupled to an RF source 122 that produces an RF signal. The RF source 122 is coupled to the substrate support pedestal 116 through a matching network 124. The process chamber 100 also includes a chamber wall 130 that is conductive and connected to an electrical ground 134.

A controller 140 comprising a central processing unit (CPU) 144, a memory 142, and support circuits 146. The controller 140 is coupled to the various components of the process chamber 100 to facilitate control of the substrate processing process.

In operation, the semiconductor substrate 114 (e.g., a wafer) is placed on the substrate support pedestal 116 and gaseous components are supplied from a gas panel 138 to the process chamber 100 through entry ports 126 to form a gaseous mixture in a processing volume 150 of the process chamber 100. The gaseous mixture in the processing volume 150 is ignited into a plasma in the process chamber 100 by applying RF power from the RF sources 118, 122 respectively to the inductive coil antenna segment 112A, the conductive coil antenna segment 1128 and to the substrate support pedestal 116. Additionally, chemically reactive ions are released from the plasma and strike the substrate; thereby removing exposed material from the substrate's surface.

The pressure within the interior of the process chamber 100 is controlled using a throttle valve 127 situated between the process chamber 100 and a vacuum pump 136. The temperature at the surface of the chamber walls 130 is controlled using liquid-containing conduits (not shown) that are located in the chamber walls 130 of the process chamber 100.

The substrate support pedestal 116 comprises an electrostatic chuck or ESC 200 disposed on a cooling base 104. The substrate support pedestal 116 is generally supported above the bottom of the process chamber 100 by a shaft 107 coupled to the cooling base 104. The substrate support pedestal 116 is fastened to the shaft 107 such that the substrate support pedestal 116 can be removed from the shaft 107, refurbished, and re-fastened to the shaft 107. The shaft 107 is sealed to the cooling base 104 to isolate various conduits and electrical leads disposed therein from the process environment within the process chamber 100. Alternatively, the ESC 200 and cooling base 104 may be disposed on an insulating plate that is attached to a ground plate or chassis. Further, the ground plate may be attached to one or more of the chamber walls 130.

The temperature of the substrate 114 is controlled by stabilizing the temperature of the ESC 200. For example, a backside gas (e.g., helium or other gas) may be provided by a gas source 148 to a plenum defined between the substrate 114 and a support surface 106 of the ESC 200. The backside gas is used to facilitate heat transfer between the substrate 114 and the substrate support pedestal 116 to control the temperature of the substrate 114 during processing. The ESC 200 may include one or more heaters. For example, the heaters may be electrical heaters or the like.

While FIG. 1 illustrates one example of a process chamber 100, it is contemplated that other process chambers may benefit from aspects of the disclosure.

Figure 2:
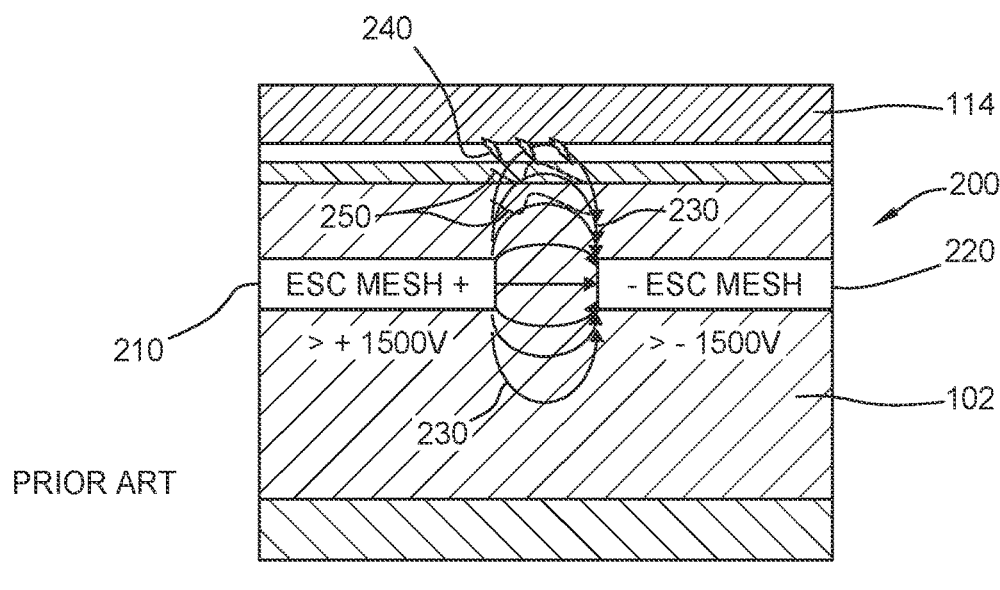
FIG. 2 is a schematic of an ESC where a DC charge is generated between the ESC and a substrate.

FIG. 2 is a schematic of an electrostatic chuck (ESC) where a DC charge is generated between the ESC and a substrate.

The electrostatic chuck or ESC 200 includes a first electrode 210 and a second electrode 220. The first electrode 210 and the second electrode 220 are formed within a dielectric 102. The first electrode 210 can be, e.g., a positive electrode and the second electrode 220 can be, e.g., a negative electrode. The first electrode 210 is placed adjacent the second electrode 220 such that the two electrodes are horizontally aligned. The first electrode 210 is placed adjacent the second electrode 220 such that a gap is formed between the two electrodes. The gap or distance between the first electrode 210 and the second electrode 220 is about 1 mm to about 3 mm. The first electrode 210 can be referred to as a positive ESC mesh and the second electrode 220 can be referred to as a negative ESC mesh. The dielectric 102 can be, e.g., aluminum nitride (AlN).

When a voltage is applied to the ESC 200, a DC field 230 is present between the first electrode 210 and the second electrode 220. The static DC voltage can be between about −1500 V and about +1500 V. The static DC voltage can be applied using an electrical conductor, such as a coaxial power delivery line (e.g., a coaxial cable).

The ESC 200 is a chuck that absorbs and fixes (chucks) a workpiece by using an electrical force that causes objects to attract each other with static electricity. When positive and negative voltages are applied to the internal electrodes of the chuck while the workpiece is placed on the chuck, the electric charges in the workpiece move so that they are attracted to the internal electrodes. This generates a Coulomb force between the electrodes and the workpiece, and the workpiece is adsorbed to the chuck. Electrostatic chucks are suitable for gripping very delicate workpieces such as substrates. In the instance case, the substrate 114 is adsorbed to the ESC 200.

Figure 3:
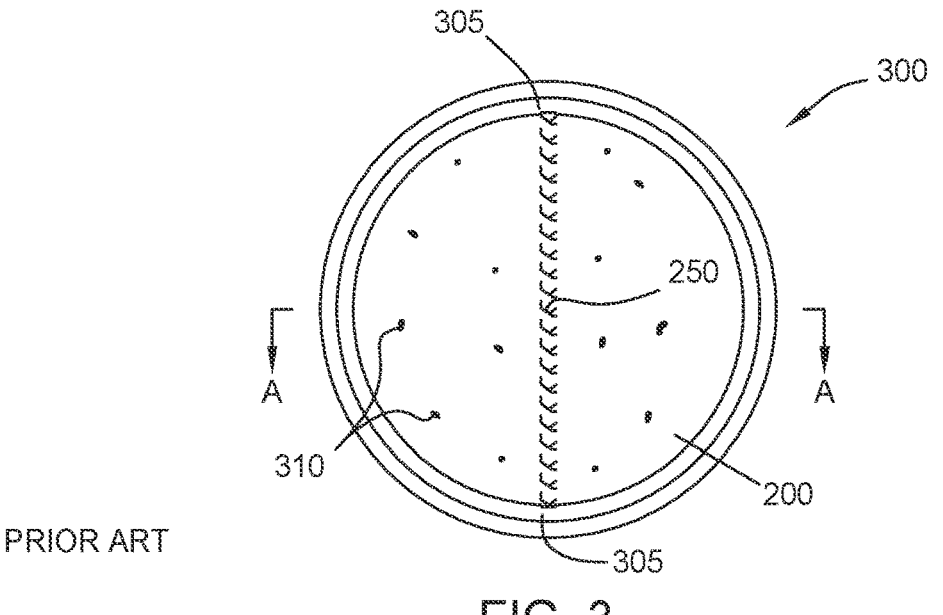
FIG. 3 is a schematic showing hatch marks or cracking formed on the ESC due to the DC charge.

The DC field 230 extends to the bottom surface of the substrate 114. The DC field 230 causes a DC discharge 240 between the substrate 114 and the ESC 200. The DC discharge 240 in turn causes hatch marks 250 on the top surface of the ESC 200. The hatch marks 250 are e.g., cracks or surface defects or mechanical defects. The hatch marks 250 extend along a length or diameter of the top surface of the ESC 200. The hatch marks 250 terminate at the ends of the top surface of the ESC 200. The hatch marks 250 do not extend into the ring that surrounds the ESC 200, as shown below with reference to FIG. 3. The hatch marks 250 extend to opposed ends of the ring 305 (FIG. 3). The hatch marks 250 are centrally disposed on the top surface of the ESC 200. The hatch marks 250 form a substantially linear line. The hatch marks 250 are formed in a region or gap between the first electrode 210 and the second electrode 220 because the electrical field is the strongest between two oppositely charge electrodes 210 and 220.

FIG. 3 is a schematic showing hatch marks formed on the ESC due to the DC charge.

The top view 300 depicts a top surface of the ESC 200. The top surface of the ESC 200 shows a plurality of mesas 310. Each of the plurality of mesas 310 can be 30 um in height. The top surface of the ESC 200 shows hatch marks 250. The hatch marks 250 form a substantially linear or straight line. The hatch marks 250 are substantially centrally disposed on the top surface of the ESC 200. The hatch marks 250 extend an entire length or diameter of the top surface of the ESC 200. The hatch marks 250 do not extend into the ring 305. The ring 305 surrounds the top surface of the ESC 200. The ring 305 may also be referred to as a sealing band. The edge of the substrate rests on the sealing band.

The mesas 310 are small area features configured to support the substrate 114. The mesas 310 can also be referred to as dimples. Mesas 310 can be of virtually any size, shape and arrangement. For example, mesas 310 can be elliptical, polygonal or torroidal, have vertical or sloped walls, the top surfaces can be concave, flat or convex, and the corners can be sharp or rounded. The mesas 310 can take on a "bump" shape wherein a partial spherical shape is emerging from a flat surface. A preferred mesa shape, size and arrangement, is circular with vertical walls, a diameter of about 1 mm, a spacing of about 5 mm, substantially covering the top surface of the ESC 200. Advantageously, mesa designs facilitate backside particle reduction and improve dechucking. In one non-limiting example, there are 120 mesas 310 on the top surface of the ESC 200. Of course, other mesa designs are contemplated with 30 or 100 or 500 or even 5000 mesas spread around the top surface of the ESC 200.

Figure 4:
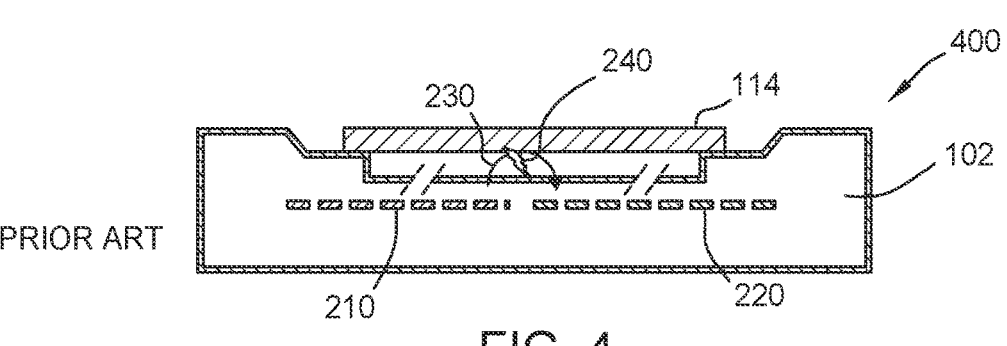
FIG. 4 is a cross-sectional view of the ESC showing the DC charge between the substrate and the ESC.

FIG. 4 is a cross-sectional view 400 of the ESC along line A-A of FIG. 3 showing the DC charge between the substrate and the ESC.

The electrostatic chuck or ESC 200 includes the first electrode 210 and the second electrode 220. The first electrode 210 and the second electrode 220 are formed within a dielectric 102. The first electrode 210 can be, e.g., a positive electrode and the second electrode 220 can be, e.g., a negative electrode. The first electrode 210 is placed adjacent the second electrode 220 such that a gap is formed between the two electrodes.

When a voltage is applied to the ESC 200, a DC field 230 is present between the first electrode 210 and the second electrode 220. The static DC voltage can be between about −1500 V and about +1500 V.

The DC field 230 extends to the bottom surface of the substrate 114. The DC field 230 causes a DC discharge 240 between the substrate 114 and the ESC 200. The DC discharge 240 in turn causes hatch marks 250 (FIG. 3) on the top surface of the ESC 200. The hatch marks 250 are e.g., cracks or surface defects or mechanical defects. The hatch marks 250 extend along a length or diameter of the top surface of the ESC 200. The hatch marks 250 terminate at the ends of the top surface of the ESC 200. The hatch marks do not extend into the ring 305. The hatch marks 250 terminate at opposed ends of the ring 305.

The DC discharge 240 is caused by the DC field generated between the first electrode 210 and the second electrode 220 when a voltage is applied to the first electrode 210 and the second electrode 220. The DC discharge 240 can result in hatch marks 250 along a top surface of the ESC 200. The DC discharge 240 occurs in a region between the bottom of the substrate 114 and the top of the ESC 200. The region between the bottom of the substrate 114 and the top surface of the ESC 200 includes process gases. Additionally, a pressure is present in this region, which is about a few Torr. These gases and pressure may be affected by the DC discharge 240 such that they may cause cracks or hatch marks 250 on the top surface of the ESC 200. In other words, the molecules of the gases in this region can break down and experience arcing. The strong arching from within the ESC 200 may cause mechanical defects on a top surface of the ESC 200.

The DC discharge 240 occurs along a central portion or section or area of the ESC 200. The DC discharge 240 occurs in a region between the first electrode 210 and the second electrode 220. The DC discharge 240 does not affect the ring 305 surrounding the ESC 200. The DC discharge 240 only affects the top surface of the ESC 200. In fact, the DC discharge 240 only affects a central, linear portion extending a diameter of the top surface of the ESC 200.

Figure 5:
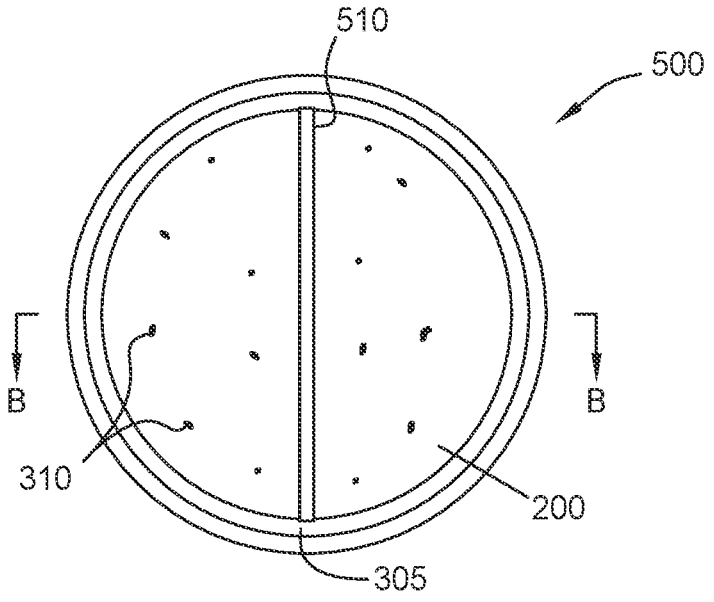
FIG. 5 is a schematic showing a mesa extending from one end of a ring to the other end of the ring filling a central space between the ESC and the substrate, according to one or more of the embodiments described herein.

FIG. 5 is a schematic top view 500 showing a mesa extending from one end of a ring to the other end of the ring filling a central space between the ESC and the substrate, according to one or more of the embodiments described herein.

The electrostatic chuck or ESC 200 includes a mesa 510 to prevent the DC discharge 240. The mesa 510 can be referred to as an area feature or a ridge or a bridge. The mesa 510 can be substantially linear and rectangular in nature. In one example, the mesa 510 may be formed from aluminum nitride (AlN). In another example, the mesa may be formed from aluminum oxide ($Al_2O_3$). The height of the mesa 510 may be in a range from about 30 um to about 50 um. The width of the mesa 510 may be in a range from about 2 mm to about 6 mm. The mesa 510 can extend along an entire length or diameter of the top surface of the ESC 200. The mesa 510 can extend to the substrate 114 such that the top surface of the mesa 510 directly contacts a bottom surface of the substrate 114. In other examples embodiments, the mesa 510 may not directly contact the bottom surface of the substrate 114. A small gap may be present between the top surface of the mesa 510 and the bottom surface of the substrate 114. The small gap may be less than about 30 um. In one example, the gap may be less than 10 um. In another example, the gap may be less than 5 um. The mesa 510 can extend from one end of the ring 305 to the other end of the ring 305. The mesa 510 may contact the ring 305 of on opposed ends thereof.

The mesa 510 does not affect the gas channel between the substrate 114 and the ESC 200. The mesa 510 also does not significantly affect heat transfer across the substrate 114. A small temperature change along the substrate 114 may be experienced. For example, the temperature change along the substrate 114 may be less than 1° C. However, such small temperature change along the substrate 114 can be considered negligible. As such, the addition of the mesa 510 does not affect the substrate 114 is any negative way.

Figure 6:
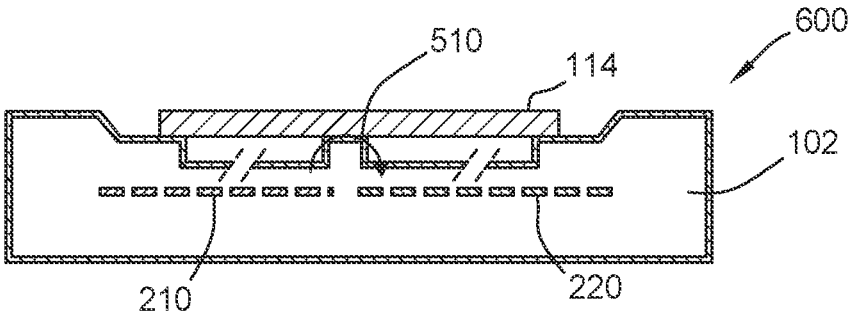
FIG. 6 is a cross-sectional view of the ESC showing the mesa between the substrate and the ESC, according to one or more of the embodiments described herein.

FIG. 6 is a cross-sectional view 600 of the ESC along line B-B of FIG. 5 showing the mesa between the substrate and the ESC, according to one or more of the embodiments described herein.

The electrostatic chuck or ESC 200 includes the first electrode 210 and the second electrode 220. The first electrode 210 and the second electrode 220 are formed within the dielectric 102. The first electrode 210 can be, e.g., a positive electrode and the second electrode 220 can be, e.g., a negative electrode. The first electrode 210 is placed adjacent the second electrode 220 such that a gap is formed between the two electrodes. The gap may be from about 1 mm to about 4 mm. In one example embodiment, the gap is from about 3 mm to about 4 mm.

When a voltage is applied to the ESC 200, a DC field 230 is present between the first electrode 210 and the second electrode 220. The static DC voltage can be between about −1500 V and about +1500 V.

The DC field 230 extends to the bottom surface of the substrate 114. The DC field 230 does not cause a DC discharge between the substrate 114 and the ESC 200. The mesa 510 centrally disposed on the top surface of the ESC 200 prevents gas breakdown in the region defined between the bottom of the substrate 114 and the top surface of the ESC 200. The positioning of the mesa 510 to extend along a diameter of the top surface of the ESC 200 prevents DC arcing within the gas breakdown area. As such, hatch marks or cracks or mechanical defects are not present on the top surface of the ESC 200.

The mesa 510 is vertically offset from the first electrode 210 and the second electrode 220. The mesa 510 is vertically aligned with a gap defined between the first electrode 210 and the second electrode 220. In one example, the mesa 510 has a thickness equal to a horizontal distance (i.e., gap) between the first electrode 210 and the second electrode 220. In another example, the mesa 510 may be made equal to or slightly lower than the gap between the substrate and the ESC surface. In the latter case, there is no direct contact between the substrate and the mesa 510, which reduces the impact of direct contact. The mesa 510 is a single continuous feature that extends a length or diameter of the top surface of the ESC 200 such that it contacts opposed ends of the ring 305 (FIG. 5). Stated differently, the mesa 510 defines a non-interrupted feature extending a length or diameter of the top surface of the ESC 200.

In summary, a new electrostatic chuck design is presented to prevent hatch marks on a top surface of the electrostatic chuck. In certain instances, a top surface of the electrostatic chuck can show hatch marks extending from one end of a ring to the other end of the ring encircling the electrostatic chuck. The example embodiments present an improved electrostatic chuck that can prevent hatch marks from being formed on the top surface thereof. The improved electrostatic chuck includes a new mesa that extends along a length or diameter of the electrostatic chuck. The new mesa prevents DC discharging between a bottom surface of the substrate and a top surface of the electrostatic chuck. The DC discharging does not extend to a region between the substrate placed on the electrostatic chuck and the top surface of the electrostatic chuck. As such, gas breakdown within such region is prevented, which, in turn, leads to less likelihood of causing mechanical defects on the top surface of the electrostatic chuck.

While this specification contains many specific implementation details, these should not be construed as limitations on the scope of what may be claimed, but rather as descriptions of features that may be specific to particular implementations. Certain features that are described in this specification in the context of separate implementations may also be implemented, in combination, in a single implementation. Conversely, various features that are described in the context of a single implementation may also be implemented in multiple implementations, separately, or in any suitable sub-combination. Moreover, although previously described features may be described as acting in certain combinations and even initially claimed as such, one or more features from a claimed combination may, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional) to achieve desirable results. In certain circumstances, multitasking or parallel processing (or a combination of multitasking and parallel processing) may be advantageous and performed as deemed appropriate. While the various steps in an embodiment method or process are presented and described sequentially, one of ordinary skill in the art will appreciate that some or all of the steps may be executed in different order, may be combined, or omitted, and some or all of the steps may be executed in parallel. The steps may be performed actively or passively. The method or process may be repeated or expanded to support multiple components or multiple users within a field environment. Accordingly, the scope should not be considered limited to the specific arrangement of steps shown in a flowchart or diagram.

Furthermore, any claimed implementation is considered to be applicable to at least a computer-implemented method; a non-transitory, computer-readable medium storing computer-readable instructions to perform the computer-implemented method; and a computer system including a computer memory interoperability coupled with a hardware processor configured to perform the computer-implemented method or the instructions stored on the non-transitory, computer-readable medium.

As used herein, "a CPU", controller", "a processor", "at least one processor", or "one or more processors", generally refers to a single processor configured to perform one or multiple operations or multiple processors configured to collectively perform one or more operations. In the case of multiple processors, performance the one or more operations could be divided amongst different processors, though one processor may perform multiple operations, and multiple processors could collectively perform a single operation. Similarly, "a memory", at least one memory", or "one or more memories", generally refers to a single memory configured to store data and/or instructions, multiple memories configured to collectively store data and/or instructions.

As used herein, "gas" and "fluid" may be used interchangeable with either term generally referring to elements, compounds, materials, etc., having the properties of a gas, a fluid, or both a gas and a fluid.

Unless defined otherwise, all technical and scientific terms used have the same meaning as commonly understood by one of ordinary skill in the art to which these systems, apparatuses, methods, processes and compositions belong.

In this disclosure, the terms "top", "bottom", "side", "above", "below", "up", "down", "upward", "downward," "horizontal," "vertical," and the like do not refer to absolute directions. Instead, these terms refer to directions relative to a nonspecific plane of reference. This non-specific plane of reference may be vertical, horizontal, or other angular orientation.

The singular forms "a", "an", and "the", include plural referents, unless the context clearly dictates otherwise. Within a claim, reference to an element in the singular is not intended to mean "one and only one" unless specifically so stated, but rather "one or more". Unless specifically stated otherwise, the term "some" refers to one or more.

Embodiments of the present disclosure may suitably "comprise", "consist", or "consist essentially of", the limiting features disclosed, and may be practiced in the absence of a limiting feature not disclosed. As used here and in the appended claims, the words "comprise", "has", and "include", and all grammatical variations thereof are each intended to have an open, non-limiting meaning that does not exclude additional elements or steps.

"Optional" and "optionally" means that the subsequently described material, event, or circumstance may or may not be present or occur. The description includes instances where the material, event, or circumstance occurs and instances where it does not occur.

"Coupled" and "coupling" means that the subsequently described material is connected to previously described material. The connection may be a direct, or indirect connection, and may, or may not, include intermediary components such as plumbing, wiring, fasteners, mechanical power transmission, electrical communication, wired and/or wireless transmission, etc., which may suitable to affect operation of the components.

As used, the term "determining" encompasses a wide variety of actions. For example, "determining" may include calculating, computing, processing, deriving, investigating, looking up, for example, looking up in a table, a database, or another data structure, and ascertaining. In addition, "determining" may include receiving, for example, receiving information, and accessing, for example, accessing data in a memory. In addition, "determining" may include resolving, selecting, choosing, and establishing.

When the word "approximately" or "about" are used, this term may mean that there may be a variance in value of up to ±10%, of up to 5%, of up to 2%, of up to 1%, of up to 0.5%, of up to 0.1%, or up to 0.01%.

Ranges may be expressed as from about one particular value to about another particular value, inclusive. When such a range is expressed, it is to be understood that another embodiment is from the one particular value to the other particular value, along with all particular values and combinations thereof within the range.

As used, terms such as "first" and "second" are arbitrarily assigned and are merely intended to differentiate between two or more components of a system, an apparatus, or a composition. It is to be understood that the words "first" and "second" serve no other purpose and are not part of the name or description of the component, nor do they necessarily define a relative location or position of the component. Furthermore, it is to be understood that that the mere use of the term "first" and "second" does not require that there be any "third" component, although that possibility is envisioned under the scope of the various embodiments described.

Although only a few example embodiments have been described in detail, those skilled in the art will readily appreciate that many modifications are possible in the example embodiments without materially departing from the disclosed scope as described. Accordingly, all such modifications are intended to be included within the scope of this disclosure as defined in the following claims. In the claims, means-plus-function clauses are intended to cover the structures described as performing the recited function and not only structural equivalents, but also equivalent structures. It is the express intention of the applicant not to invoke 35 U.S.C. § 112 (f), for any limitations of any of the claims, except for those in which the claim expressly uses the words 'means for' together with an associated function.

While the foregoing is directed to embodiments of the present disclosure, other and further embodiments of the disclosure may be devised without departing from the basic scope thereof, and the scope thereof is determined by the claims that follow.

What is claimed is:

1. An electrostatic chuck comprising:
   a ring surrounding a top surface of the electrostatic chuck; and
   a mesa being a single continuous feature extending along a diameter of the top surface of the electrostatic chuck such that the mesa contacts the ring on opposed ends thereof.

2. The electrostatic chuck of claim 1, wherein the mesa is substantially linear.

3. The electrostatic chuck of claim 1, wherein the mesa includes aluminum nitride (AlN).

4. The electrostatic chuck of claim 1, wherein the mesa contacts a bottom surface of a substrate placed over the electrostatic chuck.

5. The electrostatic chuck of claim 1, wherein the electrostatic chuck includes a first electrode and a second electrode.

6. The electrostatic chuck of claim 5, wherein, the mesa is substantially rectangular.

7. The electrostatic chuck of claim 6, wherein the mesa has a height ranging between 30 μm and 50 μm, and a width ranging between 2 mm and 6 mm.

8. The electrostatic chuck of claim 5, wherein the mesa is vertically offset from the first electrode and the second electrode.

9. The electrostatic chuck of claim 5, wherein the mesa is vertically aligned with a gap defined between the first electrode and the second electrode.

10. The electrostatic chuck of claim 5, wherein the mesa has a thickness equal to a horizontal distance between the first electrode and the second electrode.

11. An electrostatic chuck comprising:
    a first electrode and a second electrode; and
    a mesa being extending along an entirety of a diameter of a top surface of the electrostatic chuck, wherein the mesa is vertically aligned with a gap defined between the first electrode and the second electrode.

12. The electrostatic chuck of claim 11, wherein a ring is formed around the top surface of the electrostatic chuck.

13. The electrostatic chuck of claim 12, wherein the mesa contacts the ring on opposed ends thereof.

14. The electrostatic chuck of claim 11, wherein the mesa contacts a bottom surface of a substrate placed over the electrostatic chuck.

15. The electrostatic chuck of claim 11, wherein the mesa is substantially rectangular.

16. The electrostatic chuck of claim 15, wherein the mesa has a height ranging between 30 um and 50 um, and a width ranging between 2 mm and 6 mm.

17. The electrostatic chuck of claim 11, wherein the mesa is vertically offset from the first electrode and the second electrode.

18. The electrostatic chuck of claim 11, wherein the mesa is spaced from a bottom surface of a substrate by a gap of less than 30 um.

19. A method comprising:
    forming a ring surrounding a top surface of an electrostatic chuck; and
    forming a mesa being a single continuous feature extending along a diameter of the top surface of the electrostatic chuck such that the mesa contacts the ring on opposed ends thereof.

20. The method of claim 19, further comprising vertically aligning the mesa with a gap defined between a first electrode and a second electrode of the electrostatic chuck.

* * * * *